(12) United States Patent
Kim et al.

(10) Patent No.: US 12,740,494 B2
(45) Date of Patent: Sep. 15, 2026

(54) SEMICONDUCTOR PACKAGE INCLUDING AN EDGE REGION HAVING A PLURALITY OF SOLDER BALLS THEREIN

(71) Applicant: SAMSUNG ELECTRONICS CO., LTD., Suwon-si (KR)

(72) Inventors: Tong Suk Kim, Suwon-si (KR); Sang Woong Lee, Suwon-si (KR); Shle-Ge Lee, Suwon-si (KR); Seung Soo Ha, Suwon-si (KR); Chang Ui Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 306 days.

(21) Appl. No.: 18/372,257

(22) Filed: Sep. 25, 2023

(65) Prior Publication Data

US 2024/0234274 A1 Jul. 11, 2024

(30) Foreign Application Priority Data

Jan. 11, 2023 (KR) ........................ 10-2023-0003814

(51) Int. Cl.

*H10W 90/00* (2026.01)
*H10W 70/65* (2026.01)
*H10W 74/15* (2026.01)

(52) U.S. Cl.

CPC ......... *H10W 90/701* (2026.01); *H10W 70/65* (2026.01); *H10W 90/00* (2026.01); *H10W 74/15* (2026.01); *H10W 90/724* (2026.01); *H10W 90/734* (2026.01)

(58) Field of Classification Search

CPC ......... H01L 24/06; H01L 24/13; H01L 24/14; H01L 24/17; H01L 24/81; H01L 25/0657; H01L 25/16; H01L 25/50; H01L 25/165; H01L 23/642; H10W 72/072; H10W 72/30; H10W 72/851; H10W 72/20;

(Continued)

(56) References Cited

U.S. PATENT DOCUMENTS 6,423,577 B1 7/2002 Cheng et al.
7,378,733 B1 5/2008 Hoang et al.
9,263,186 B2 2/2016 Li et al.

(Continued)

FOREIGN PATENT DOCUMENTS

KR 10-1999-0033213 A 5/1999

*Primary Examiner* — Steven B Gauthier
*Assistant Examiner* — Marc-Anthony Armand
(74) *Attorney, Agent, or Firm* — Muir Patent Law, PLLC

(57) ABSTRACT

A semiconductor package, including a first structure including a ball array region on a lower surface of the first structure and an external region completely surrounding the ball array region, the ball array region including a passive element region in which solder balls are not disposed and an edge region completely surrounding the passive element region, a first semiconductor chip on an upper surface of the first structure, a passive element in the passive element region on the lower surface of the first structure, the passive element not in the edge region on the lower surface of the first structure, and a first ball array in the edge region on the lower surface of the first structure, the first ball array including two or more first power solder balls supplying power to at least one of the passive element and the first semiconductor chip.

20 Claims, 11 Drawing Sheets

(58) Field of Classification Search
CPC . H10W 72/90; H10W 90/297; H10W 90/722; H10W 44/601; H10W 70/635
See application file for complete search history.

(56) References Cited

U.S. PATENT DOCUMENTS

| | | | | |
|---|---|---|---|---|
| 10,373,884 | B2 | 8/2019 | Kim et al. | |
| 10,892,316 | B2 | 1/2021 | Kirkman | |
| 2011/0313119 | A1* | 12/2011 | Konze | C08F 10/00 526/89 |
| 2011/0316119 | A1* | 12/2011 | Kim | H01G 4/30 257/532 |
| 2020/0152559 | A1* | 5/2020 | Lai | H10W 90/701 |
| 2020/0168528 | A1* | 5/2020 | Cheah | H01L 24/32 |
| 2022/0148984 | A1 | 5/2022 | Chen et al. | |

* cited by examiner

SEMICONDUCTOR PACKAGE INCLUDING AN EDGE REGION HAVING A PLURALITY OF SOLDER BALLS THEREIN

CROSS-REFERENCE TO RELATED APPLICATION

Korean Patent Application No. 10-2023-0003814 filed on Jan. 11, 2023, in the Korean Intellectual Property Office, is incorporated by reference herein in its entirety.

BACKGROUND

1. Field

A semiconductor package including an edge region having a plurality of solder balls therein is disclosed.

2. Description of the Related Art

As high-performance elements become more desirable, a size of a semiconductor chip is increasing, and a size of a semiconductor package is increasing accordingly to meet these high-performance demands. On the other hand, a decreased thickness of the semiconductor package is desirable due to a trend of slim electronic devices.

SUMMARY

Embodiments are directed to a semiconductor package, including a first structure including a ball array region on a lower surface of the first structure and an external region completely surrounding the ball array region, the ball array region including a passive element region in which solder balls are not disposed and an edge region completely surrounding the passive element region, a first semiconductor chip on an upper surface of the first structure, a passive element in the passive element region on the lower surface of the first structure, the passive element not in the edge region on the lower surface of the first structure, and a first ball array in the edge region on the lower surface of the first structure, the first ball array including two or more first power solder balls supplying power to at least one of the passive element and the first semiconductor chip, the first ball array being directly adjacent to first sidewalls of the passive element in a first horizontal direction and directly adjacent to second sidewalls of the passive element in a second horizontal direction, respectively, the second horizontal direction being perpendicular to the first horizontal direction.

Embodiments are directed to a semiconductor package, including a substrate including a ball array region on a lower surface of the substrate and an external region completely surrounding the ball array region, the ball array region including a passive element region in which solder balls are not disposed and an edge region completely surrounding the passive element region, a passive element in the passive element region on the lower surface of the substrate, the passive element not in the edge region on the lower surface of the substrate, and a first ball array in the edge region on the lower surface of the substrate, the first ball array including two or more power solder balls supplying power to the passive element and ground solder balls grounding the passive element, the first ball array being directly adjacent to first sidewalls of the passive element in a first horizontal direction and directly adjacent to second sidewalls of the passive element in a second horizontal direction, respectively, the second horizontal direction being perpendicular to the first horizontal direction.

Embodiments are directed to a semiconductor package, including a substrate including a ball array region on a lower surface of the substrate and an external region completely surrounding the ball array region, the ball array region including a passive element region in which solder balls are not disposed and an edge region completely surrounding the passive element region, a first semiconductor chip on an upper surface of the substrate, a passive element in the passive element region on the lower surface of the substrate, the passive element not in the edge region on the lower surface of the substrate, a ball array between the external region and the passive element region on the lower surface of the substrate, the ball array including two or more first power solder balls supplying power to at least one of the passive element and the first semiconductor chip, the ball array including first ground solder balls grounding at least one of the passive element and the first semiconductor chip, the ball array being directly adjacent to first sidewalls of the passive element in a first horizontal direction and directly adjacent to second sidewalls of the passive element in a second horizontal direction, respectively, the second horizontal direction being perpendicular to the first horizontal direction, a first conductive pad in the passive element region on the lower surface of the substrate, the first conductive pad connecting the substrate and the passive element to each other, the first conductive pad electrically connecting the passive element and the first ground solder balls to each other, a second conductive pad in the passive element region on the lower surface of the substrate, the second conductive pad connecting the substrate and the passive element to each other, the second conductive pad being spaced apart from the first conductive pad in the first horizontal direction, the second conductive pad electrically connecting the passive element and the first power solder balls to each other, second power solder balls in the external region on the lower surface of the substrate, the second power solder balls supplying power to the first semiconductor chip, second ground solder balls in the external region on the lower surface of the substrate, the second ground solder balls grounding the first semiconductor chip, and signal solder balls in the external region on the lower surface of the substrate, the signal solder balls supplying a signal to at least one of the passive element and the first semiconductor chip.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, a semiconductor device according to some exemplary embodiments of the present disclosure will be described with reference to FIGS. 1 and 2.

Figure 1:
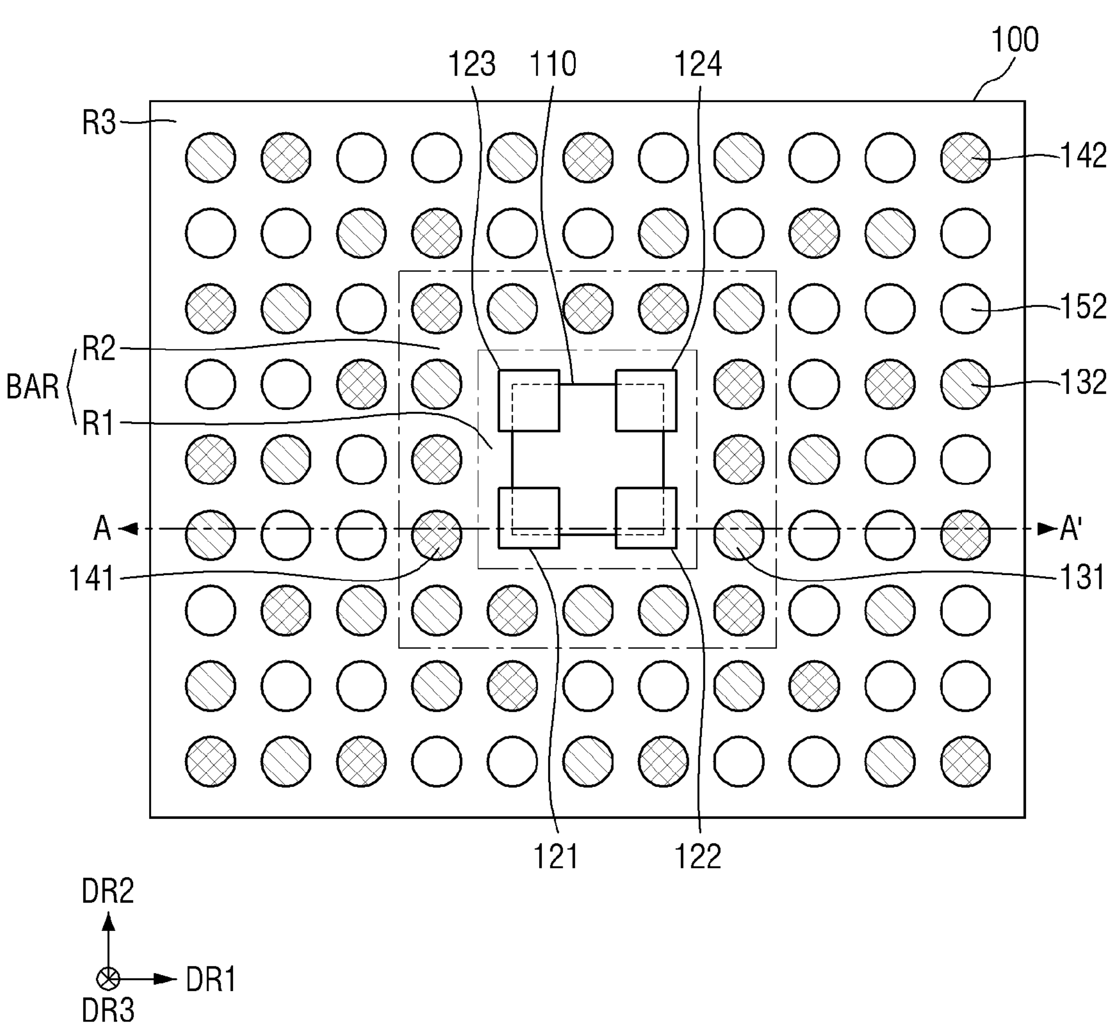
FIG. 1 is a plan view showing a semiconductor package according to example embodiments.
Figure 2:
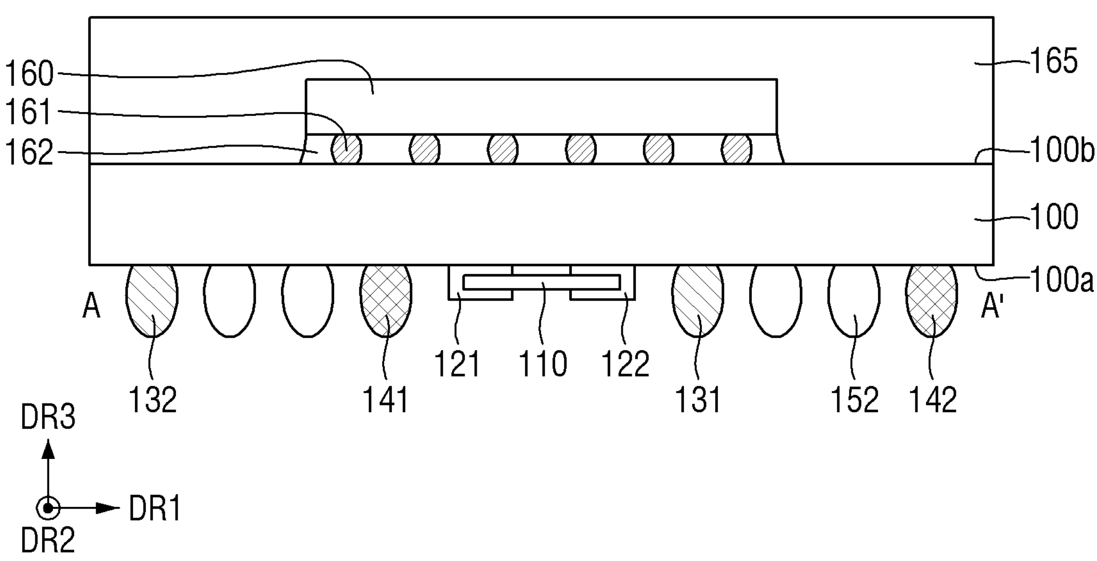
FIG. 2 is a cross-sectional view taken along line A-A' of FIG. 1.

FIG. 1 is a plan view showing a semiconductor package according to example embodiments. FIG. 2 is a cross-sectional view taken along line A-A' of FIG. 1. Referring to FIGS. 1 and 2, a semiconductor package according to some exemplary embodiments of the present disclosure may include a first structure 100, a passive element 110, first to fourth conductive pads 121, 122, 123, and 124, first and second power solder balls 131 and 132, first and second ground solder balls 141 and 142, a second signal solder ball 152, a first semiconductor chip 160, a first connection terminal 161, a first underfill material 162, and a molding layer 165.

The first structure 100 may include a lower surface 100*a* and an upper surface 100*b* opposite to the lower surface 100*a*. The first structure 100 may be, e.g., a printed circuit board (PCB) or a ceramic substrate.

When the first structure 100 is a printed circuit board, the first structure 100 may be a phenol resin, an epoxy resin, or polyimide. In an implementation, the first structure 100 may include FR4, tetrafunctional epoxy, polyphenylene ether, epoxy/polyphenylene oxide, bismaleimide triazine (BT), thermount, cyanate ester, polyimide, or liquid crystal polymer. As used herein, the term "or" is not an exclusive term, e.g., "A or B" would include A, B, or A and B.

Hereinafter, each of a first horizontal direction DR1 and a second horizontal direction DR2 may be defined as a direction parallel to the upper surface 100*b* of the first structure 100. The second horizontal direction DR2 may be defined as a direction perpendicular to the first horizontal direction DR1. A vertical direction DR3 may be defined as a direction perpendicular to each of the first horizontal direction DR1 and the second horizontal direction DR2. In an implementation, the vertical direction DR3 may be defined as a direction perpendicular to the upper surface 100*b* of the first structure 100.

A ball array region BAR and an external region R3 may be defined on the lower surface 100*a* of the first structure 100. In an implementation, in a plane defined by the first horizontal direction DR1 and the second horizontal direction DR2, the ball array region BAR may have a quadrangular shape. In the plane defined by the first horizontal direction DR1 and the second horizontal direction DR2, the external region R3 may surround the ball array region BAR. The external region R3 may be directly adjacent to the ball array region BAR. Throughout the specification, being "directly adjacent" may mean having no other regions between the two elements. Here, being "directly adjacent" may mean that no other regions are between the external region R3 and the ball array region BAR.

The ball array region BAR may include a passive element region R1 and an edge region R2. In an implementation, each of the passive element region R1 and the edge region R2 may be defined on the lower surface 100*a* of the first structure 100. The passive element region R1 may be a region in which a passive element 110 described later is disposed. Solder balls may be in the passive element region R1. In an implementation, in the plane defined by the first horizontal direction DR1 and the second horizontal direction DR2, the passive element region R1 may have a quadrangular shape.

In the plane defined by the first horizontal direction DR1 and the second horizontal direction DR2, the edge region R2 may surround the passive element region R1. The edge region R2 may be directly adjacent to the passive element region R1. In an implementation, in the plane defined by the first horizontal direction DR1 and the second horizontal direction DR2, the edge region R2 may have a quadrangular shape. In an implementation, in the plane defined by the first horizontal direction DR1 and the second horizontal direction DR2, each of the edges of the passive element region R1, the edge region R2, and the external region R3 may have a quadrangular shape.

In addition, in the plane defined by the first horizontal direction DR1 and the second horizontal direction DR2, the external region R3 may surround the edge region R2. The external region R3 may be directly adjacent to the edge region R2.

The first semiconductor chip 160 may be on the upper surface 100*b* of the first structure 100. In an implementation, the first semiconductor chip 160 may be a logic semiconductor chip. The first semiconductor chip 160 may be, e.g., a micro-processor. The first semiconductor chip 160 may be, e.g., a central processing unit (CPU), a controller, or an application specific integrated circuit (ASIC).

In an implementation, the first semiconductor chip 160 may be an HBM semiconductor chip. In an implementation, the first semiconductor chip 160 may include a plurality of stacked memory semiconductor chips. Each of the plurality of memory semiconductor chips may be a volatile memory semiconductor chip such as a dynamic random access memory (DRAM) or a static random access memory (SRAM), or may be a non-volatile memory semiconductor chip such as a phase-change random access memory (PRAM), a magnetoresistive random access memory (MRAM), a ferroelectric random access memory (FeRAM), or a resistive random access memory (RRAM).

The first connection terminal 161 may be between the upper surface 100*b* of the first structure 100 and a lower surface of the first semiconductor chip 160. The first semiconductor chip 160 may be attached to the upper surface 100*b* of the first structure 100 through the first connection terminal 161. The first structure 100 and the first semiconductor chip 160 may be electrically connected to each other using the first connection terminal 161. The first connection terminal 161 may include, e.g., tin (Sn), indium (In), lead (Pb), zinc (Zn), nickel (Ni), gold (Au), silver (Ag), copper (Cu), antimony (Sb), or bismuth (Bi).

The first underfill material 162 may surround a sidewall of the first connection terminal 161 between the upper surface 100*b* of the first structure 100 and the lower surface of the first semiconductor chip 160. In an implementation, the first underfill material 162 may protrude more in a lateral direction than a sidewall of the first semiconductor chip 160. The first underfill material 162 may include an insulating material.

The molding layer 165 may be on the upper surface 100*b* of the first structure 100. The molding layer 165 may cover a sidewall of the first underfill material 162 and the first semiconductor chip 160. The molding layer 165 may include, e.g., an epoxy molding compound (EMC) or two or more silicone hybrid materials.

The passive element 110 may be on the lower surface 100*a* of the first structure 100. In an implementation, the passive element 110 may be in the passive element region R1. In an implementation, the passive element 110 may not be in the edge region R2. In an implementation, only one passive element 110 may be in the passive element region R1. Hereinafter, it will be described that only one passive element 110 may be in the passive element region R1.

The passive element 110 may be, e.g., a capacitor. In an implementation, the passive element 110 may be a silicon capacitor, a multilayer ceramic capacitor (MLCC), or a low inductance ceramic capacitor (LICC).

Each of the first to fourth conductive pads 121, 122, 123, and 124 may be on the lower surface 100*a* of the first structure 100. Each of the first to fourth conductive pads 121, 122, 123, and 124 may be in the passive element region R1. In an implementation, each of the first to fourth conductive pads 121, 122, 123, and 124 may protrude from the lower surface 100*a* of the first structure 100. In an implementation, each of the first to fourth conductive pads 121, 122, 123, and 124 may be in contact with a sidewall of the passive element 110. Each of the first to fourth conductive pads 121, 122, 123, and 124 may include a conductive material.

Each of the first to fourth conductive pads 121, 122, 123, and 124 may be electrically connected to a wiring inside the first structure 100. In addition, each of the first to fourth conductive pads 121, 122, 123, and 124 may be electrically connected to the passive element 110. In an implementation, each of the first to fourth conductive pads 121, 122, 123, and 124 may electrically connect the first structure 100 and the passive element 110 to each other.

In an implementation, each of the first to fourth conductive pads 121, 122, 123, and 124 may be spaced apart from each other in the first horizontal direction DR1 and the second horizontal direction DR2, respectively. In an implementation, the second conductive pad 122 may be spaced apart from the first conductive pad 121 in the first horizontal direction DR1. The third conductive pad 123 may be spaced apart from the first conductive pad 121 in the second horizontal direction DR2. The fourth conductive pad 124 may be spaced apart from the third conductive pad 123 in the first horizontal direction DR1. In addition, the fourth conductive pad 124 may be spaced apart from the second conductive pad 122 in the second horizontal direction DR2.

In an implementation, each of the first conductive pad 121 and the fourth conductive pad 124 may ground the passive element 110. In an implementation, each of the second conductive pad 122 and the third conductive pad 123 may supply power to the passive element 110. It is illustrated in FIG. 1 that a planar shape of each of the first to fourth conductive pads 121, 122, 123, and 124 may have a quadrangular shape. In an implementation, each of the first to fourth conductive pads 121, 122, 123, and 124 may not be in the edge region R2. In some other exemplary embodiments, at least a portion of each of the first to fourth conductive pads 121, 122, 123, and 124 may be in the edge region R2.

A plurality of solder balls may be in the edge region R2 on the lower surface 100*a* of the first structure 100. In an implementation, a first ball array may be in the edge region R2 on the lower surface 100*a* of the first structure 100. In an implementation, the first ball array may be in one line in the edge region R2. Throughout the specification, "in one line" may mean being between two regions which would otherwise be directly adjacent to one another. Here, being "in one line" may mean that one solder ball is between the passive element region R1 and the external region R3 that would otherwise be directly adjacent to each other.

In an implementation, the first ball array may be directly adjacent to both sidewalls of the passive element 110 in the first horizontal direction DR1. In addition, the first ball array may be directly adjacent to both sidewalls of the passive element 110 in the second horizontal direction DR2. In other words, the first ball array may be in the edge region R2 surrounding the passive element region R1 in a quadrangular shape.

In an implementation, the plurality of solder balls included in the first ball array may be sequentially spaced at equal pitches. In other words, the first ball array may include a plurality of solder balls sequentially spaced apart from one another in a quadrangular shape. In an implementation, among the plurality of solder balls included in the first ball array, distances between the solder balls directly adjacent to each other in the first horizontal direction DR1 or the second horizontal direction DR2 may be the same as each other. In some other exemplary embodiments, among the plurality of solder balls included in the first ball array, at least some of the distances between the solder balls directly adjacent to each other in the first horizontal direction DR1 or the second horizontal direction DR2 may be different from each other.

In an implementation, the first ball array may include a first power solder ball 131 and a first ground solder ball 141. The first power solder ball 131 may be in the edge region R2 on the lower surface 100*a* of the first structure 100. In an implementation, two or more first power solder balls 131 may be in the edge region R2. In an implementation, the first power solder ball 131 may be electrically connected to any one of the second conductive pad 122 and the third conductive pad 123 through the wiring inside the first structure 100. In addition, the first power solder ball 131 may be electrically connected to the first semiconductor chip 160 through the wiring inside the first structure 100. The first power solder ball 131 may supply power to at least one of the passive element 110 and the first semiconductor chip 160.

The first ground solder ball 141 may be in the edge region R2 on the lower surface 100*a* of the first structure 100. In an implementation, one or more first ground solder balls 141 may be in the edge region R2. In an implementation, the first ground solder ball 141 may be electrically connected to any one of the first conductive pad 121 and the fourth conductive pad 124 through the wiring inside the first structure 100. In addition, the first ground solder ball 141 may be electrically connected to the first semiconductor chip 160 through the wiring inside the first structure 100. The first ground solder ball 141 may ground at least one of the passive element 110 and the first semiconductor chip 160.

In an implementation, the plurality of solder balls in the edge region R2 may include only the first power solder balls 131 and the first ground solder balls 141. In an implementation, a signal solder ball supplying a signal to at least one of the passive element 110 and the first semiconductor chip 160 may not be in the edge region R2.

Each of the first power solder ball 131 and the first ground solder ball 141 may include a conductive material. Each of the first power solder ball 131 and the first ground solder ball 141 may include, e.g., tin (Sn), indium (In), lead (Pb), zinc (Zn), nickel (Ni), gold (Au), silver (Ag), copper (Cu), antimony (Sb), or bismuth (Bi).

A plurality of solder balls may be in the external region R3 on the lower surface 100*a* of the first structure 100. In an implementation, a plurality of second power solder balls 132, a plurality of second ground solder balls 142, and a plurality of second signal solder balls 152 may be in the external region R3.

In an implementation, the second power solder ball 132 may be electrically connected to the first semiconductor chip 160 through the wiring inside the first structure 100. The second power solder ball 132 may supply power to the first semiconductor chip 160. In an implementation, the second ground solder ball 142 may be electrically connected to the first semiconductor chip 160 through the wiring inside the first structure 100. The second ground solder ball 142 may ground the first semiconductor chip 160. In an implementation, the second signal solder ball 152 may be electrically connected to the first semiconductor chip 160 through the wiring inside the first structure 100. The second signal solder ball 152 may supply a signal to the first semiconductor chip 160.

Each of the second power solder ball 132, the second ground solder ball 142, and the second signal solder ball 152 may include a conductive material. Each of the second power solder ball 132, the second ground solder ball 142, and the second signal solder ball 152 may include, e.g., tin (Sn), indium (In), lead (Pb), zinc (Zn), nickel (Ni), gold (Au), silver (Ag), copper (Cu), antimony (Sb), or bismuth (Bi).

In the semiconductor package according to some exemplary embodiments of the present disclosure, even if cracks occur in some of the power solder balls 131, an electrical connection relationship of the remaining power solder balls 131 may be maintained by disposing two or more power solder balls 131 that supply the power to the passive element 110 directly adjacent to the passive element 110, in the structure in which the passive element 110 may be mounted on the lower surface of the first structure 100, which may be the substrate. As a result, reliability of the electrical connection relationship of the semiconductor package may be improved.

Hereinafter, a semiconductor package according to some other exemplary embodiments of the present disclosure will be described with reference to FIG. 3. Differences from the semiconductor package illustrated in FIGS. 1 and 2 will be mainly described.

Figure 3:
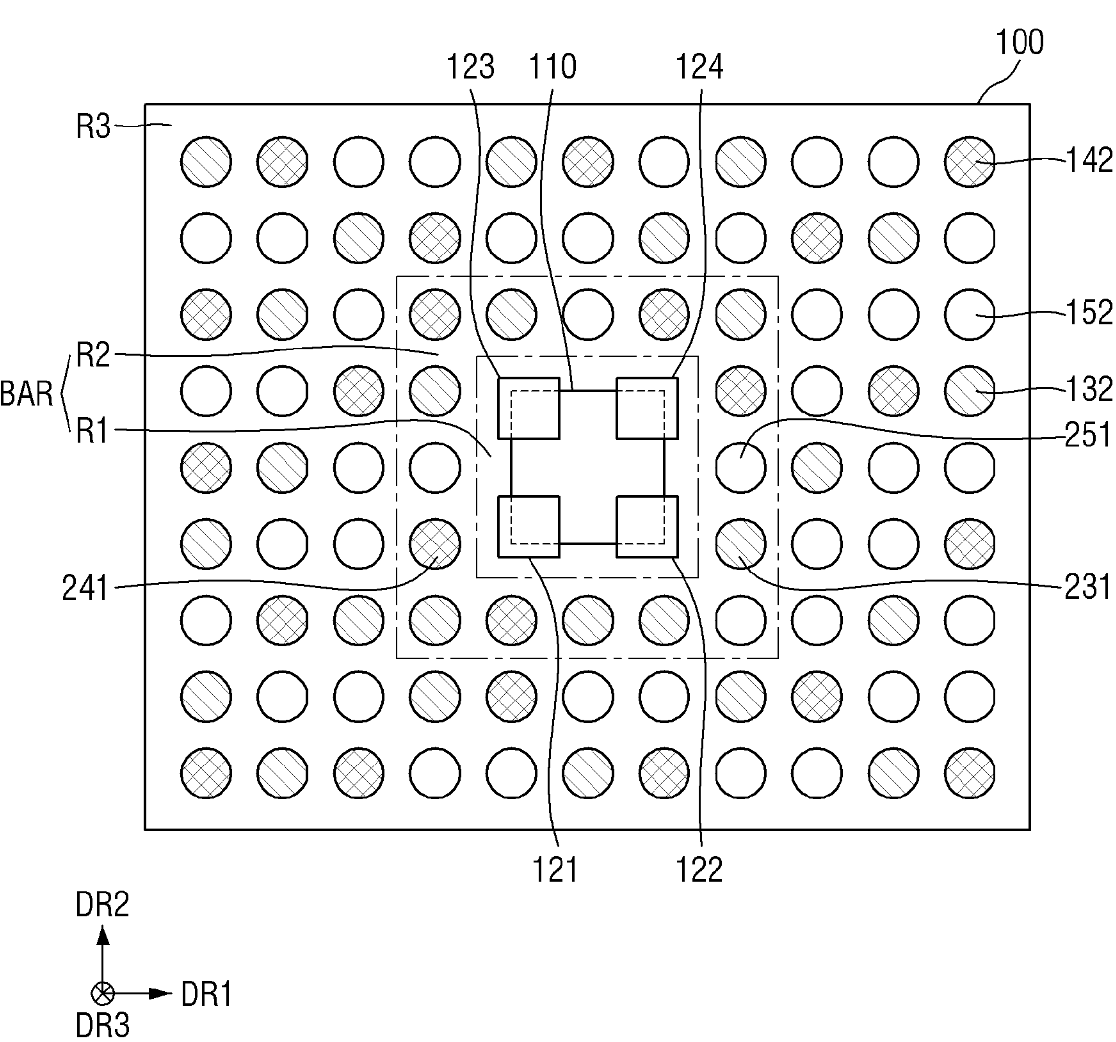
FIG. 3 is a plan view showing a semiconductor package including signal solder balls in an edge region according to example embodiments.

FIG. 3 is a plan view showing a semiconductor package including signal solder balls in an edge region according to example embodiments. Referring to FIG. 3, in a semiconductor package according to some other exemplary embodiments of the present disclosure, a first ball array in an edge region R2 may include a first power solder ball 231, a first ground solder ball 241, and a first signal solder ball 251.

In an implementation, two or more first power solder balls 231 may be in the edge region R2. In an implementation, the first power solder ball 231 may be electrically connected to any one of the second conductive pad 122 and the third conductive pad 123 through the wiring inside the first structure 100. In addition, the first power solder ball 231 may be electrically connected to the first semiconductor chip (160 in FIG. 2) through the wiring inside the first structure 100. The first power solder ball 231 may supply power to at least one of the passive element 110 and the first semiconductor chip (160 in FIG. 2).

In an implementation, one or more first ground solder balls 241 may be in the edge region R2. In an implementation, the first ground solder ball 241 may be electrically connected to any one of the first conductive pad 121 and the fourth conductive pad 124 through the wiring inside the first structure 100. In addition, the first ground solder ball 241 may be electrically connected to the first semiconductor chip (160 in FIG. 2) through the wiring inside the first structure 100. The first ground solder ball 241 may ground at least one of the passive element 110 and the first semiconductor chip (160 in FIG. 2).

In an implementation, one or more first signal solder balls 251 may be in the edge region R2. In an implementation, the first signal solder ball 251 may be electrically connected to the passive element 110 through the wiring inside the first structure 100. In addition, the first signal solder ball 251 may be electrically connected to the first semiconductor chip (160 in FIG. 2) through the wiring inside the first structure 100. The first signal solder ball 251 may supply a signal to at least one of the passive element 110 and the first semiconductor chip (160 in FIG. 2).

Hereinafter, a semiconductor package according to some still other exemplary embodiments of the present disclosure will be described with reference to FIG. 4. Differences from the semiconductor package illustrated in FIGS. 1 and 2 will be mainly described.

Figure 4:
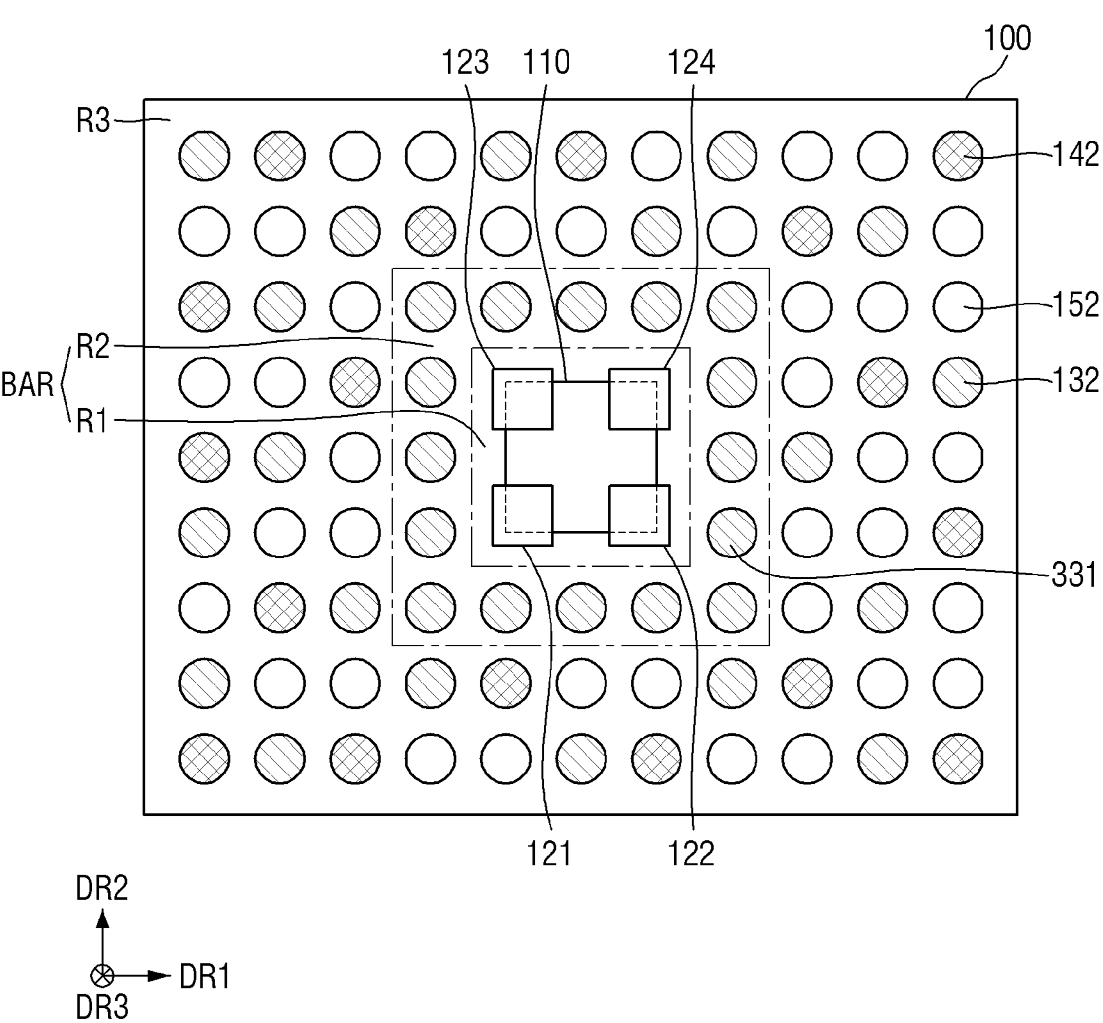
FIG. 4 is a plan view showing a semiconductor package including only power solder balls in an edge region according to example embodiments.

FIG. 4 is a plan view showing a semiconductor package including only power solder balls in an edge region according to example embodiments. Referring to FIG. 4, in a semiconductor package, the first ball array in the edge region R2 may include only first power solder balls 331.

In an implementation, all solder balls directly adjacent to the passive element 110 may be the first power solder balls 331. In an implementation, the first power solder ball 331 may be electrically connected to any one of the second conductive pad 122 and the third conductive pad 123 through the wiring inside the first structure 100. In addition, the first power solder ball 331 may be electrically connected to the first semiconductor chip (160 in FIG. 2) through the wiring inside the first structure 100. The first power solder ball 331 may supply power to at least one of the passive element 110 and the first semiconductor chip (160 in FIG. 2).

Hereinafter, a semiconductor package according to some still other exemplary embodiments of the present disclosure will be described with reference to FIG. 5. Differences from the semiconductor package illustrated in FIGS. 1 and 2 will be mainly described.

Figure 5:
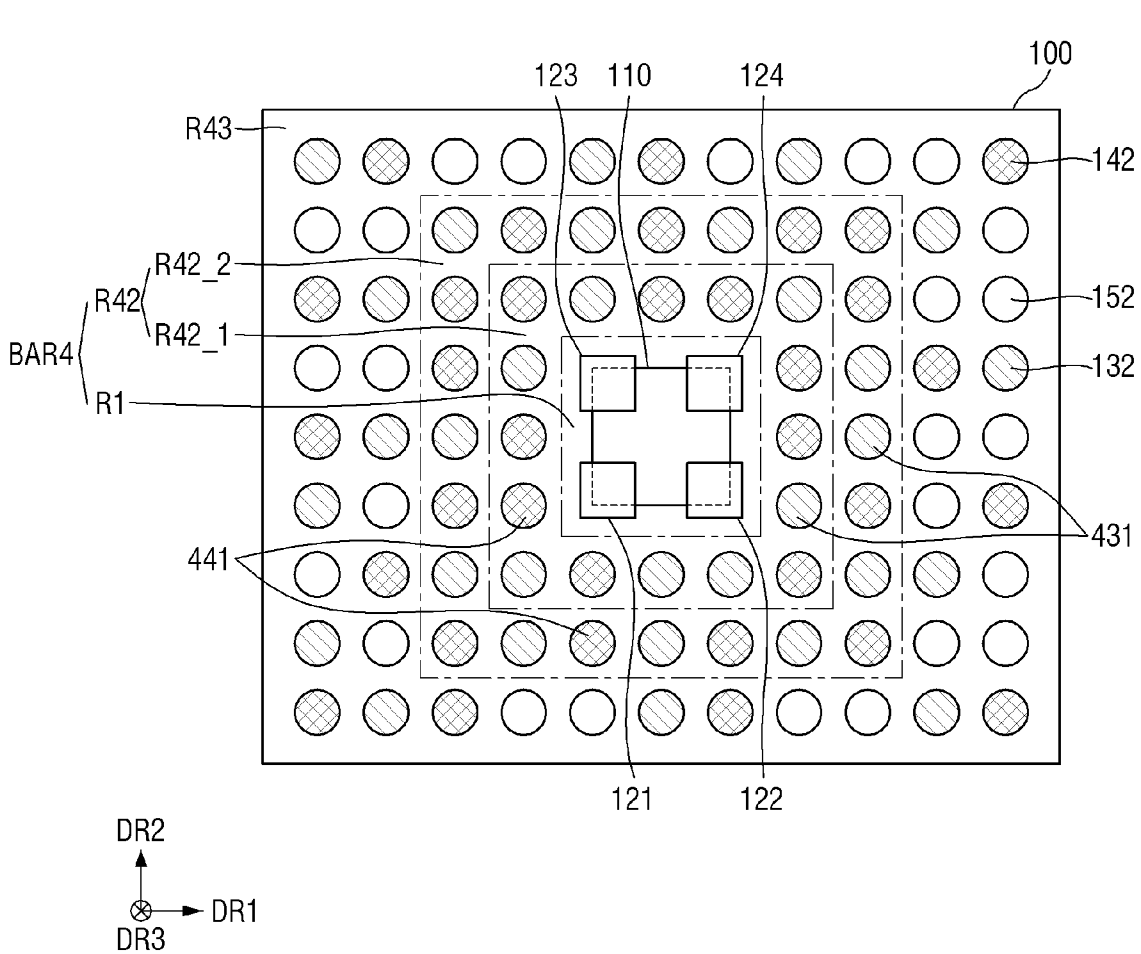
FIG. 5 is a plan view showing a semiconductor package including a first edge region and a second edge region according to example embodiments.

FIG. 5 is a plan view showing a semiconductor package including a first edge region and a second edge region according to example embodiments. Referring to FIG. 5, in a semiconductor package an edge region R42 may include a first edge region R42_1 and a second edge region R42_2 completely surrounding the first edge region R42_1.

In an implementation, a ball array region BAR4 may include a passive element region R1, a first edge region R42_1, and a second edge region R42_2. In an implementation, the first edge region R42_1 may surround the passive element region R1. The first edge region R42_1 may be directly adjacent to the passive element region R1.

In an implementation, the second edge region R42_2 may surround the first edge region R42_1. The second edge region R42_2 may be directly adjacent to the first edge region R42_1. In an implementation, the external region R43 may surround the second edge region R42_2. The external region R43 may be directly adjacent to the second edge region R42_2.

In an implementation, a first ball array may be in the first edge region R42_1 and the second edge region R42_2. The first ball array may include a second ball array and a third ball array. The second ball array may be in the first edge region R42_1. In an implementation, the second ball array may be in one line in the first edge region R42_1. Here, being "in one line" may mean that one solder ball is between the passive element region R1 and the second edge region R42_2 that would otherwise be directly adjacent to each other. The third ball array may be in the second edge region R42_2. In an implementation, the third ball array may be in one line in the second edge region R42_2. Here, being "in one line" may mean that one solder ball is between the first edge region R42_1 and the external region R43 that would otherwise be directly adjacent to each other.

In an implementation, two or more first power solder balls 431 may be in each of the first edge region R42_1 and the second edge region R42_2. In an implementation, the first power solder ball 431 may be electrically connected to any one of the second conductive pad 122 and the third conductive pad 123 through the wiring inside the first structure 100. In addition, the first power solder ball 431 may be electrically connected to the first semiconductor chip (160 in FIG. 2) through the wiring inside the first structure 100. The first power solder ball 431 may supply power to at least one of the passive element 110 and the first semiconductor chip (160 in FIG. 2).

In an implementation, one or more first ground solder balls 441 may be in each of the first edge region R42_1 and the second edge region R42_2. In an implementation, the first ground solder ball 441 may be electrically connected to any one of the first conductive pad 121 and the fourth conductive pad 124 through the wiring inside the first structure 100. In addition, the first ground solder ball 441 may be electrically connected to the first semiconductor chip (160 in FIG. 2) through the wiring inside the first structure 100. The first ground solder ball 441 may ground at least one of the passive element 110 and the first semiconductor chip (160 in FIG. 2).

In an implementation, the plurality of solder balls in each of the first and second edge regions R42_1 and R42_2 may include only the first power solder balls 431 and the first ground solder balls 441. In an implementation, the signal solder ball that supplies a signal to at least one of the passive element 110 and the first semiconductor chip (160 in FIG. 2) may not be in each of the first edge region R42_1 and the second edge region R42_2.

Hereinafter, a semiconductor package according to some still other exemplary embodiments of the present disclosure will be described with reference to FIG. 6. Differences from the semiconductor package illustrated in FIG. 5 will be mainly described.

Figure 6:
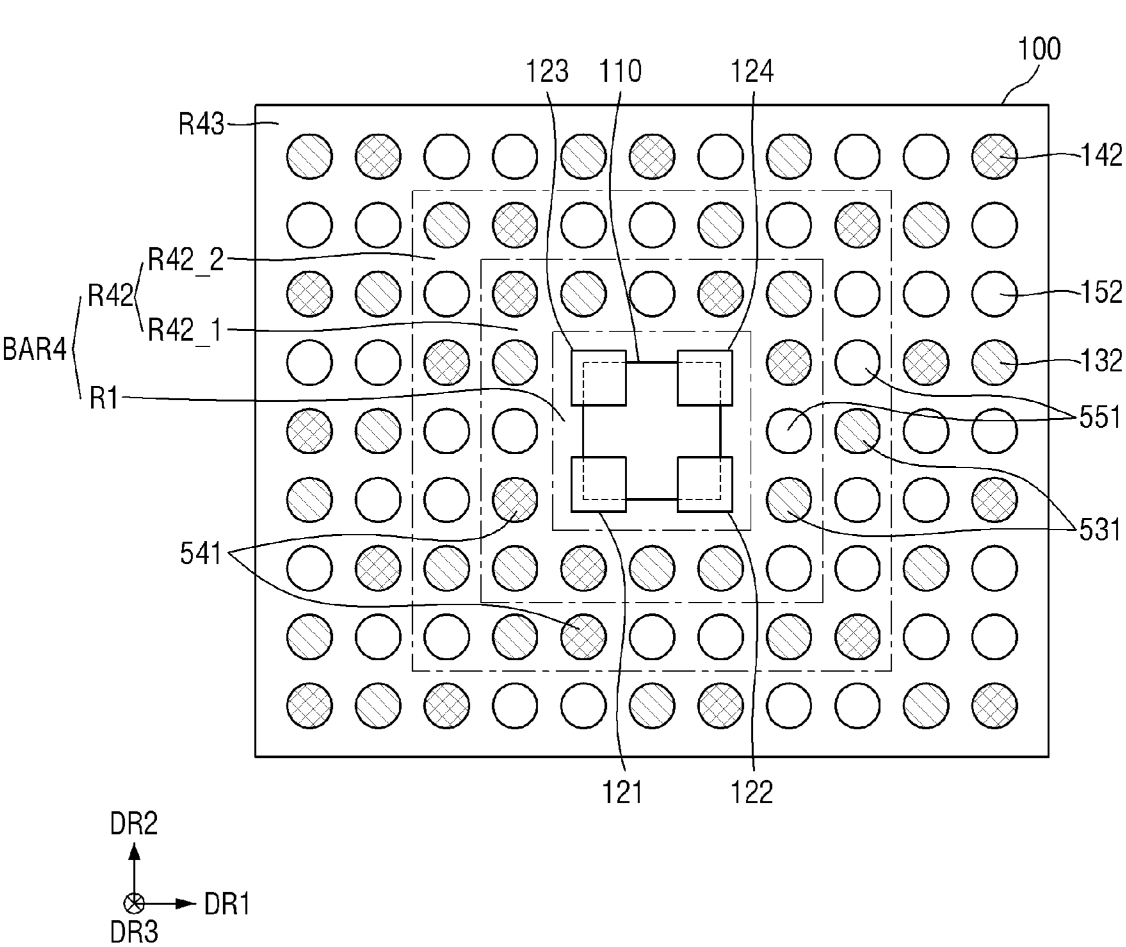
FIG. 6 is a plan view showing a semiconductor package including a first edge region and a second edge region each having signal solder balls according to example embodiments.

FIG. 6 is a plan view showing a semiconductor package including a first edge region and a second edge region each having signal solder balls according to example embodiments. Referring to FIG. 6, in a semiconductor package each of the second ball array in the first edge region R42_1 and the third ball array in the second edge region R42_2 may include first power solder balls 531, first ground solder balls 541, and first signal solder balls 551.

In an implementation, two or more first power solder balls 531 may be in each of the first edge region R42_1 and the second edge region R42_2. In an implementation, the first power solder ball 531 may be electrically connected to any one of the second conductive pad 122 and the third conductive pad 123 through the wiring inside the first structure 100. In addition, the first power solder ball 531 may be electrically connected to the first semiconductor chip (160 in FIG. 2) through the wiring inside the first structure 100. The first power solder ball 531 may supply power to at least one of the passive element 110 and the first semiconductor chip (160 in FIG. 2).

In an implementation, one or more first ground solder balls 541 may be in each of the first edge region R42_1 and the second edge region R42_2. In an implementation, the first ground solder ball 541 may be electrically connected to any one of the first conductive pad 121 and the fourth conductive pad 124 through the wiring inside the first structure 100. In addition, the first ground solder ball 541 may be electrically connected to the first semiconductor chip (160 in FIG. 2) through the wiring inside the first structure 100. The first ground solder ball 541 may ground at least one of the passive element 110 and the first semiconductor chip (160 in FIG. 2).

In an implementation, one or more first signal solder balls 551 may be in each of the first edge region R42_1 and the second edge region R42_2. In an implementation, the first signal solder ball 551 may be electrically connected to the passive element 110 through the wiring inside the first structure 100. In addition, the first signal solder ball 551 may be electrically connected to the first semiconductor chip (160 in FIG. 2) through the wiring inside the first structure 100. The first signal solder ball 551 may supply a signal to at least one of the passive element 110 and the first semiconductor chip (160 in FIG. 2).

Hereinafter, a semiconductor package according to some still other exemplary embodiments of the present disclosure will be described with reference to FIG. 7. Differences from the semiconductor package illustrated in FIG. 5 will be mainly described.

Figure 7:
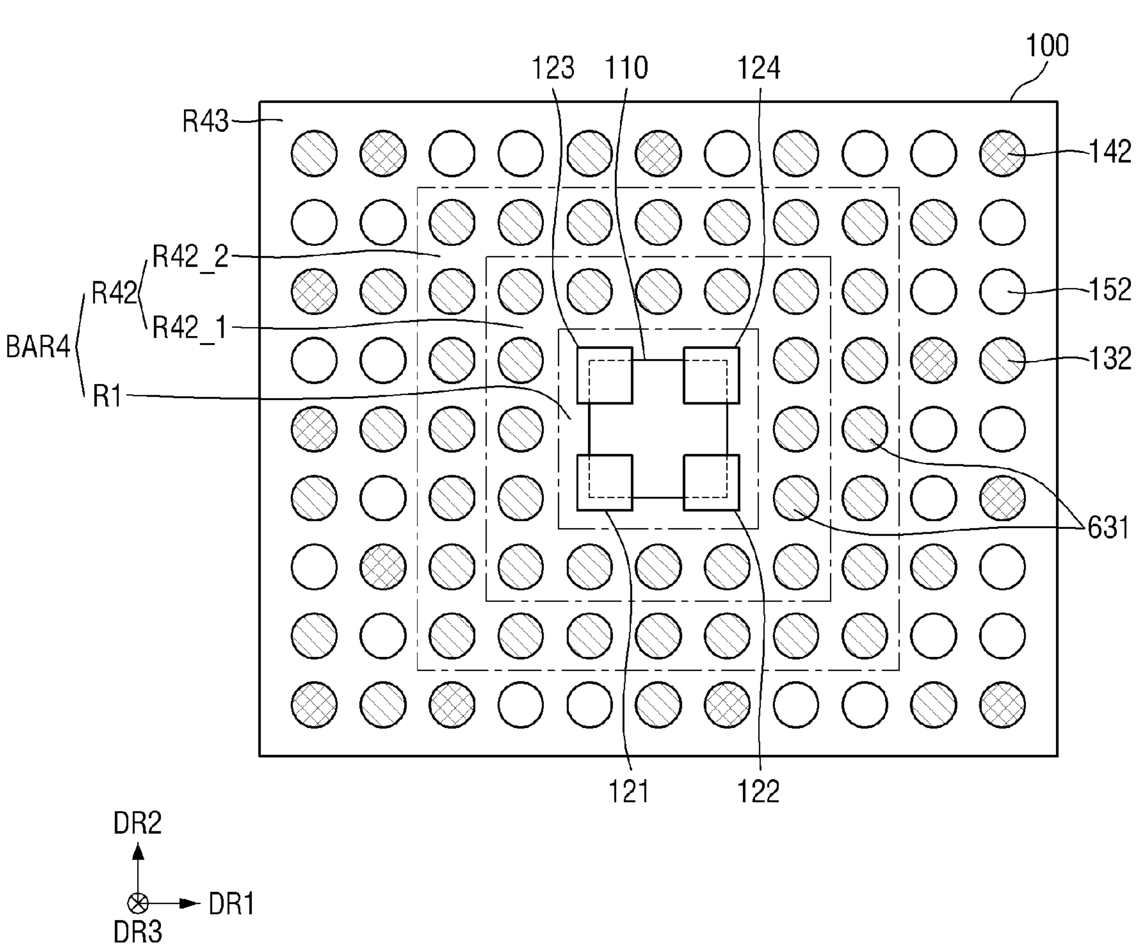
FIG. 7 is a plan view showing a semiconductor package including a first edge region and a second edge region each having only power solder balls according to example embodiments.

FIG. 7 is a plan view showing a semiconductor package including a first edge region and a second edge region each having only power solder balls according to example embodiments. Referring to FIG. 7, in a semiconductor package, each of the second ball array in the first edge region R42_1 and the third ball array in the second edge region R42_2 may include only first power solder balls 631.

In an implementation, all solder balls directly adjacent to the passive element 110 may be the first power solder balls 631. In an implementation, the first power solder ball 631 may be electrically connected to any one of the second conductive pad 122 and the third conductive pad 123 through the wiring inside the first structure 100. In addition, the first power solder ball 631 may be electrically connected to the first semiconductor chip (160 in FIG. 2) through the wiring inside the first structure 100. The first power solder ball 631 may supply power to at least one of the passive element 110 and the first semiconductor chip (160 in FIG. 2).

Hereinafter, a semiconductor package according to some still other exemplary embodiments of the present disclosure will be described with reference to FIG. 8. Differences from the semiconductor package illustrated in FIG. 5 will be mainly described.

Figure 8:
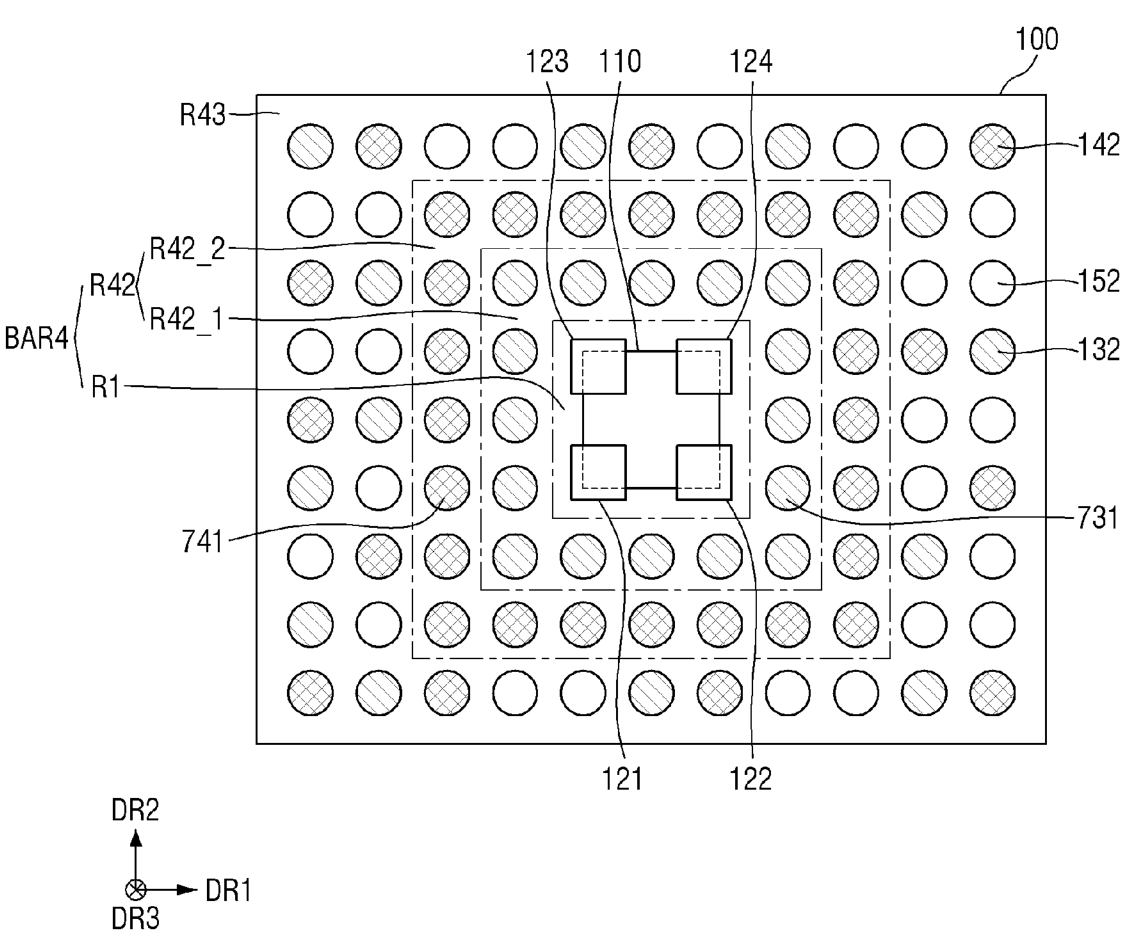
FIG. 8 is a plan view showing a semiconductor package including a first edge region having only power solder balls and a second edge region having only ground solder balls according to example embodiments.

FIG. 8 is a plan view showing a semiconductor package including a first edge region having only power solder balls and a second edge region having only ground solder balls according to example embodiments. Referring to FIG. 8, in a semiconductor package, the second ball array in the first edge region R42_1 may include only first power solder balls 731, and the third ball array in the second edge region R42_2 may include only first ground solder balls 741.

In an implementation, the first power solder balls 731 may be in one line in the first edge region R42_1. Each of the ground solder balls and the signal solder balls may not be in the first edge region R42_1. In an implementation, the first ground solder balls 741 may be in one line in the second edge region R42_2. Each of the power solder balls and the signal solder balls may not be in the second edge region R42_2.

Hereinafter, a semiconductor package according to some still other exemplary embodiments of the present disclosure will be described with reference to FIG. 9. Differences from the semiconductor package illustrated in FIG. 5 will be mainly described.

Figure 9:
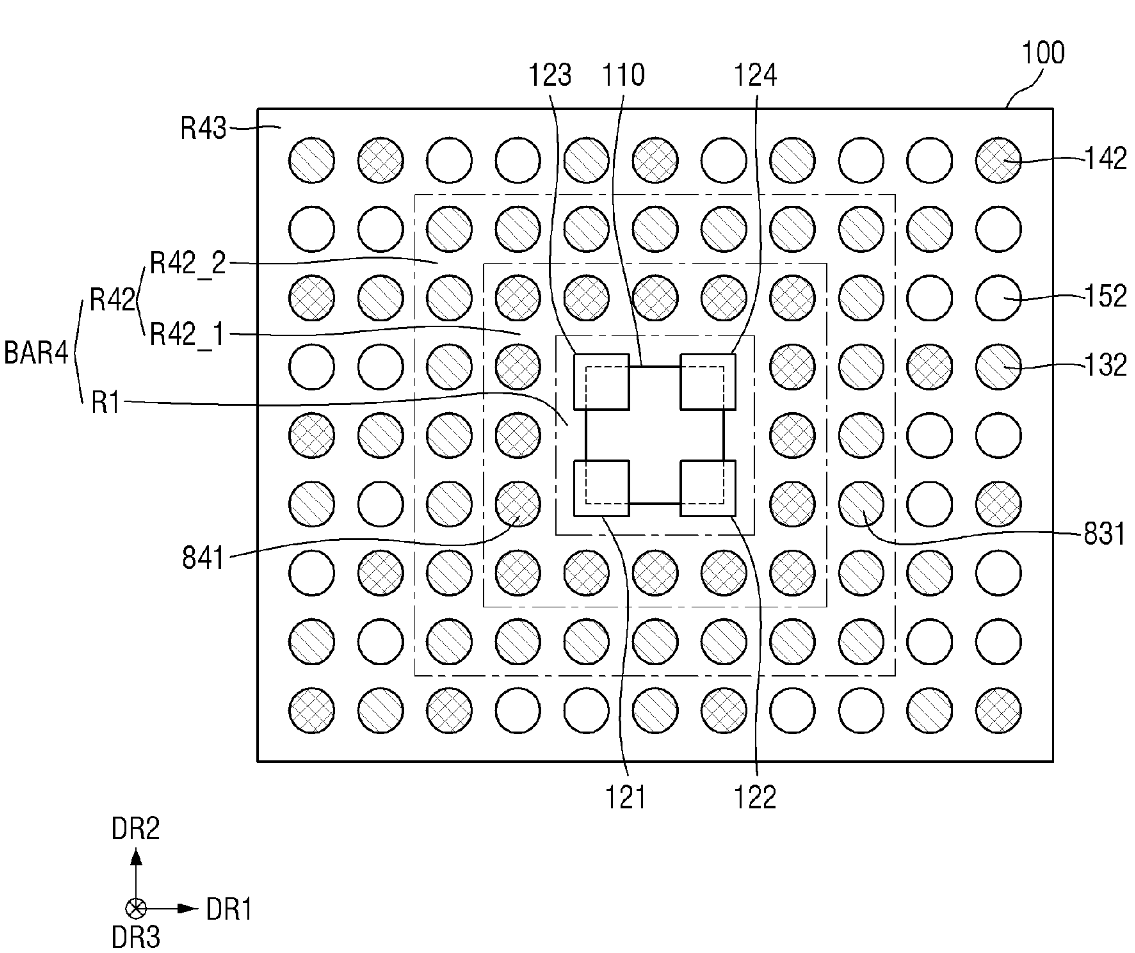
FIG. 9 is a plan view showing a semiconductor package including a first edge region having only ground solder balls and a second edge region having only power solder balls according to example embodiments.

FIG. 9 is a plan view showing a semiconductor package including a first edge region having only ground solder balls and a second edge region having only power solder balls according to example embodiments. Referring to FIG. 9, in a semiconductor package, the second ball array in the first edge region R42_1 may include only first ground solder balls 841, and the third ball array in the second edge region R42_2 may include only first power solder balls 831.

In an implementation, the first ground solder balls 841 may be in one line in the first edge region R42_1. Each of the power solder balls and the signal solder balls may not be in the first edge region R42_1. In an implementation, the first power solder balls 831 may be in one line in the second edge region R42_2. Each of the ground solder balls and the signal solder balls may not be in the second edge region R42_2.

Hereinafter, a semiconductor package according to some still other exemplary embodiments of the present disclosure will be described with reference to FIG. 10. Differences from the semiconductor package illustrated in FIGS. 1 and 2 will be mainly described.

Figure 10:
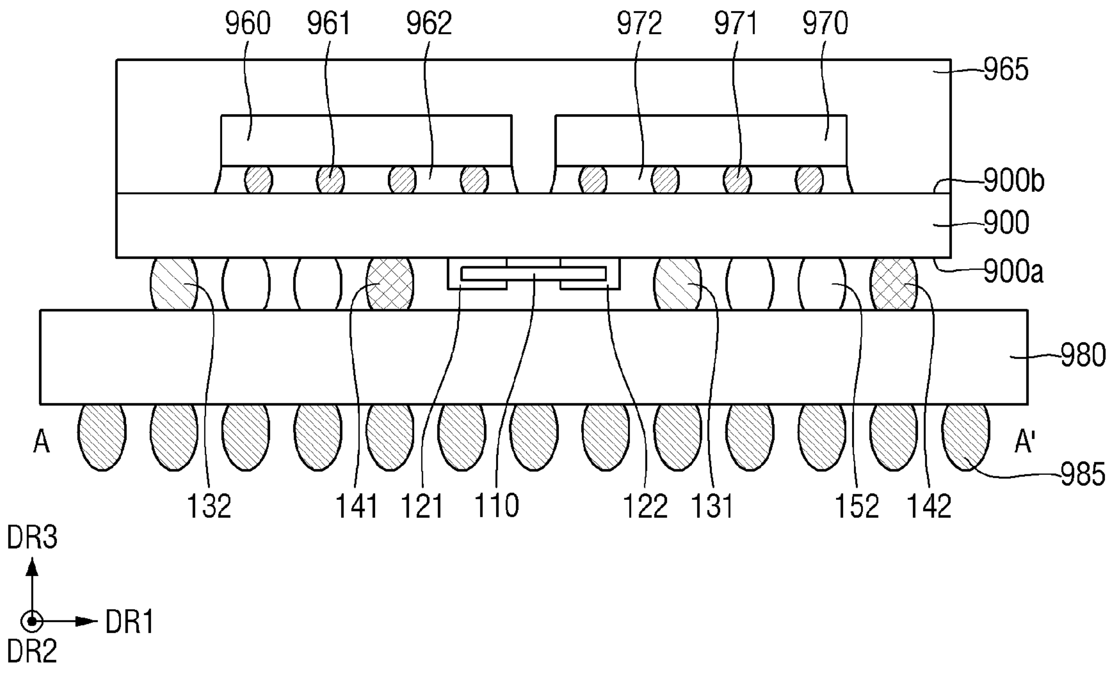
FIG. 10 is a cross-sectional view taken along line A-A' of FIG. 1 including a two-tiered structure.

FIG. 10 is a cross-sectional view taken along line A-A' of FIG. 1 including a two-tiered structure. Referring to FIG. 10, a semiconductor package may include a first structure 900, a passive element 110, first and second conductive pads 121 and 122, first and second power solder balls 131 and 132, first and second ground solder balls 141 and 142, a second signal solder ball 152, a first semiconductor chip 960, a first connection terminal 961, a first underfill material 962, a second semiconductor chip 970, a second connection terminal 971, a second underfill material 972, a molding layer 965, a second structure 980, and a third connection terminal 985.

Each of the passive element 110, the first and second conductive pads 121 and solder balls 141 and 142, and the second signal solder ball 152 may be on a lower surface 900*a* of the first structure 900. Each of the passive element 110, the first and second conductive pads 121 and 122, the first and second power solder balls 131 and 132, the first and second ground solder balls 141 and 142, and the second signal solder ball 152 illustrated in FIG. 10 may have the same structure as each of the passive element 110, the first and second conductive pads 121 and 122, the first and second power solder balls 131 and 132, the first and second ground solder balls 141 and 142, and the second signal solder ball 152 illustrated in FIG. 1, and a detailed description thereof will be thus omitted.

In an implementation, the first structure 900 may be an interposer. Each of the first semiconductor chip 960 and the second semiconductor chip 970 may be on an upper surface 900*b* of the first structure 900. In an implementation, the second semiconductor chip 970 may be spaced apart from the first semiconductor chip 960 in the first horizontal direction DR1. The first semiconductor chip 960 and the second semiconductor chip 970 may be electrically connected to each other through the first structure 900.

In an implementation, each of the first semiconductor chip 960 and the second semiconductor chip 970 may be a logic semiconductor chip. In an implementation, each of the first semiconductor chip 960 and the second semiconductor chip 970 may be, e.g., a micro-processor. Each of the first semiconductor chip 960 and the second semiconductor chip 970 may be, e.g., a central processing unit (CPU), a controller, or an application specific integrated circuit (ASIC).

In an implementation, each of the first semiconductor chip 960 and the second semiconductor chip 970 may be an HBM semiconductor chip. In an implementation, each of the first semiconductor chip 960 and the second semiconductor chip 970 may include a plurality of stacked memory semiconductor chips. Each of the plurality of memory semiconductor chips may be a volatile memory semiconductor chip such as a dynamic random access memory (DRAM) or a static random access memory (SRAM), or may be a non-volatile memory semiconductor chip such as a phase-change random access memory (PRAM), a magnetoresistive random access memory (MRAM), a ferroelectric random access memory (FeRAM), or a resistive random access memory (RRAM).

The first connection terminal 961 may be between the upper surface 900*b* of the first structure 900 and a lower surface of the first semiconductor chip 960. The first semiconductor chip 960 may be attached to the upper surface 900*b* of the first structure 900 through the first connection terminal 961. The first structure 900 and the first semiconductor chip 960 may be electrically connected to each other using the first connection terminal 961. The second connection terminal 971 may be between the upper surface 900*b* of the first structure 900 and a lower surface of the second semiconductor chip 970. The second semiconductor chip 970 may be attached to the upper surface 900*b* of the first structure 900 through the second connection terminal 971. The first structure 900 and the second semiconductor chip 970 may be electrically connected to each other using the second connection terminal 971.

Each of the first connection terminal 961 and the second connection terminal 971 may include, e.g., tin (Sn), indium (In), lead (Pb), zinc (Zn), nickel (Ni), gold (Au), silver (Ag), copper (Cu), antimony (Sb), or bismuth (Bi).

The first underfill material 962 may surround a sidewall of the first connection terminal 961 between the upper surface 900*b* of the first structure 900 and the lower surface of the first semiconductor chip 960. The second underfill material 972 may surround a sidewall of the second connection terminal 971 between the upper surface 900*b* of the first structure 900 and the lower surface of the second semiconductor chip 970. Each of the first underfill material 962 and the second underfill material 972 may include an insulating material.

The molding layer 965 may be on the upper surface 900*b* of the first structure 900. The molding layer 965 may cover a sidewall of the first underfill material 962, a sidewall of the second underfill material 972, and each of the first semiconductor chip 960 and the second semiconductor chip 970. The molding layer 965 may include, e.g., an epoxy molding compound (EMC) or two or more silicone hybrid materials.

The second structure 980 may be on a lower surface 900*a* of the first structure 900. The second structure 980 may be, e.g., a printed circuit board (PCB) or a ceramic substrate. The second structure 980 may be connected to the first structure 900 through the first ball array. In an implementation, the second structure 980 may be connected to the lower surface 900*a* of the first structure 900 by using each of the first and second power solder balls 131 and 132, the first and second ground solder balls 141 and 142, and the second signal solder ball 152. In an implementation, the upper surface of the second structure 980 may be spaced apart from each of the passive element 110 and the first and second conductive pads 121 and 122 in the vertical direction DR3.

The third connection terminal 985 may be on a lower surface of the second structure 980. The third connection terminal 985 may convexly protrude from the lower surface of the second structure 980. The third connection terminal 985 may be a portion where the second structure 980 is electrically connected to other external elements. The third connection terminal 985 may include, e.g., tin (Sn), indium (In), lead (Pb), zinc (Zn), nickel (Ni), gold (Au), silver (Ag), copper (Cu), antimony (Sb), or bismuth (Bi).

Hereinafter, a semiconductor package according to some still other exemplary embodiments of the present disclosure will be described with reference to FIG. 11. Differences from the semiconductor package illustrated in FIGS. 1 and 2 will be mainly described.

Figure 11:
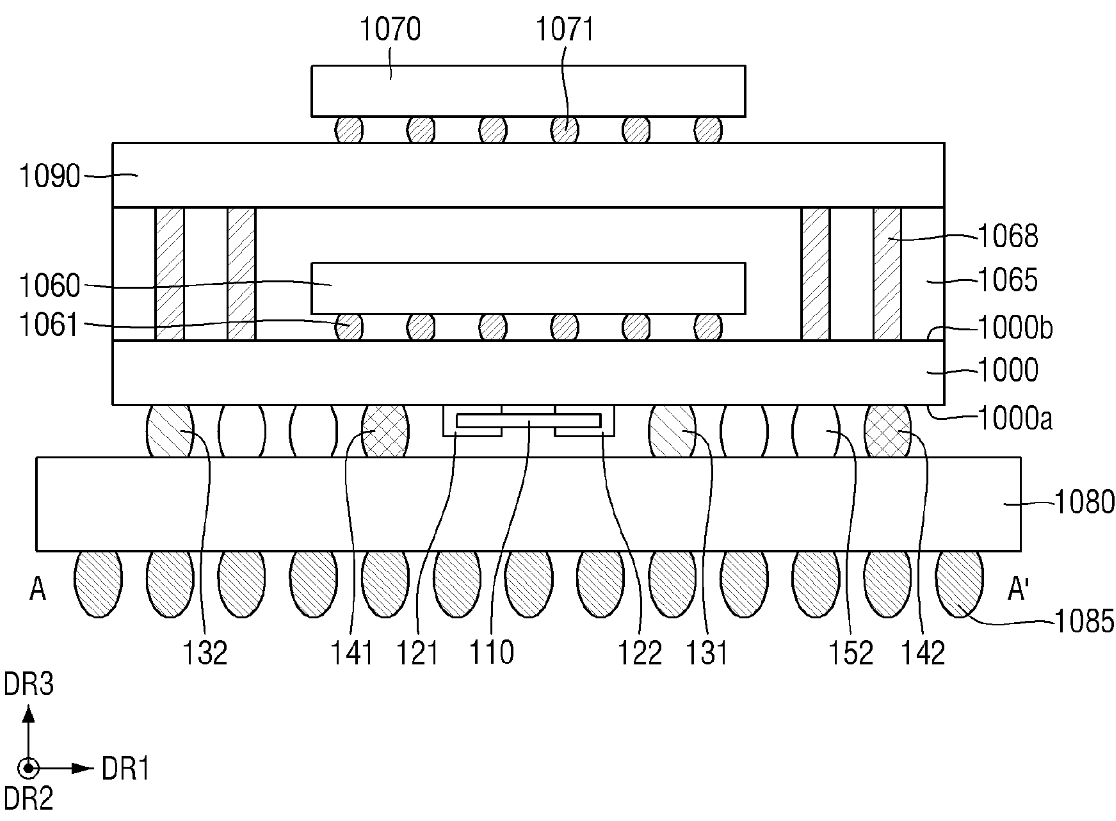
FIG. 11 is a cross-sectional view taken along line A-A' of FIG. 1 including a three-tiered structure.

FIG. 11 is a cross-sectional view taken along line A-A' of FIG. 1 including a three-tiered structure. Referring to FIG. 11, a semiconductor package may include a first structure 1000, a passive element 110, first and second conductive pads 121 and 122, first and second power solder balls 131 and 132, first and second ground solder balls 141 and 142, a second signal solder ball 152, a first semiconductor chip 1060, a first connection terminal 1061, a molding layer 1065, a post 1068, a second structure 1080, a third connection terminal 1085, a third structure 1090, a second semiconductor chip 1070, and a second connection terminal 1071.

Each of the passive element 110, the first and second conductive pads 121 and solder balls 141 and 142, and the second signal solder ball 152 may be on a lower surface 1000*a* of the first structure 1000. Each of the passive element 110, the first and second conductive pads 121 and 122, the first and second power solder balls 131 and 132, the first and second ground solder balls 141 and 142, and the second signal solder ball 152 illustrated in FIG. 11 may have the same structure as each of the passive element 110, the first and second conductive pads 121 and 122, the first and second power solder balls 131 and 132, the first and second ground solder balls 141 and 142, and the second signal solder ball 152 illustrated in FIG. 1, and a detailed description thereof will be thus omitted.

In an implementation, the first structure 1000 may be a redistribution layer including a plurality of wirings. The first semiconductor chip 1060 may be on an upper surface 1000*b* of the first structure 1000. In an implementation, the first semiconductor chip 1060 may be a logic semiconductor chip. The first semiconductor chip 1060 may be, e.g., a micro-processor. The first semiconductor chip 1060 may be, e.g., a central processing unit (CPU), a controller, or an application specific integrated circuit (ASIC).

In an implementation, the first semiconductor chip 1060 may be an HBM semiconductor chip. In an implementation, the first semiconductor chip 1060 may include a plurality of stacked memory semiconductor chips. Each of the plurality of memory semiconductor chips may be a volatile memory semiconductor chip such as a dynamic random access memory (DRAM) or a static random access memory (SRAM), or may be a non-volatile memory semiconductor chip such as a phase-change random access memory (PRAM), a magnetoresistive random access memory (MRAM), a ferroelectric random access memory (FeRAM), or a resistive random access memory (RRAM).

The first connection terminal 1061 may be between the upper surface 1000*b* of the first structure 1000 and a lower surface of the first semiconductor chip 1060. The first semiconductor chip 1060 may be attached to the upper surface 1000*b* of the first structure 1000 through the first connection terminal 1061. The first structure 1000 and the first semiconductor chip 1060 may be electrically connected to each other using the first connection terminal 1061. The first connection terminal 1061 may include, e.g., tin (Sn), indium (In), lead (Pb), zinc (Zn), nickel (Ni), gold (Au), silver (Ag), copper (Cu), antimony (Sb), or bismuth (Bi).

The molding layer 1065 may be on the upper surface 1000*b* of the first structure 1000. The molding layer 1065 may cover the first semiconductor chip 1060. The molding layer 1065 may include, e.g., an epoxy molding compound (EMC) or two or more silicone hybrid materials. In an implementation, an upper surface of the molding layer 1065 may be higher than an upper surface of the first semiconductor chip 1060.

The post 1068 may be on a sidewall of the first semiconductor chip 1060 on the upper surface 1000*b* of the first structure 1000. The post 1068 may penetrate through the molding layer 1065 in the vertical direction DR3 and be connected to the upper surface 1000*b* of the first structure 1000. The post 1068 may include a conductive material. The third structure 1090 may be on the upper surface of the molding layer 1065. In an implementation, the third structure 1090 may be a redistribution layer including a plurality of wirings. The first structure 1000 and the third structure 1090 may be electrically connected to each other using the post 1068.

The second semiconductor chip 1070 may be on an upper surface 100*b* of the third structure 1090. The second semiconductor chip 1070 may be electrically connected to the first semiconductor chip 1060 through the third structure 1090, the post 1068, and the first structure 1000. In an implementation, the second semiconductor chip 1070 may be a logic semiconductor chip. The second semiconductor chip 1070 may be, e.g., a micro-processor. The second semiconductor chip 1070 may be, e.g., a central processing unit (CPU), a controller, or an application specific integrated circuit (ASIC).

In an implementation, the second semiconductor chip 1070 may be an HBM semiconductor chip. In an implementation, the second semiconductor chip 1070 may include a plurality of stacked memory semiconductor chips. Each of the plurality of memory semiconductor chips may be a volatile memory semiconductor chip such as a dynamic random access memory (DRAM) or a static random access memory (SRAM), or may be a non-volatile memory semiconductor chip such as a phase-change random access memory (PRAM), a magnetoresistive random access memory (MRAM), a ferroelectric random access memory (FeRAM), or a resistive random access memory (RRAM).

The second connection terminal 1071 may be between the upper surface of the third structure 1090 and a lower surface of the second semiconductor chip 1070. The second semiconductor chip 1070 may be attached to the upper surface of the third structure 1090 through the second connection terminal 1071. The third structure 1090 and the second semiconductor chip 1070 may be electrically connected to each other using the second connection terminal 1071. The second connection terminal 1071 may include, e.g., tin (Sn), indium (In), lead (Pb), zinc (Zn), nickel (Ni), gold (Au), silver (Ag), copper (Cu), antimony (Sb), or bismuth (Bi).

The second structure 1080 may be on the lower surface 1000_a_ of the first structure 1000. The second structure 1080 may be, e.g., a printed circuit board (PCB) or a ceramic substrate. The second structure 1080 may be connected to the first structure 1000 through the first ball array. In an implementation, the second structure 1080 may be connected to the lower surface 1000_a_ of the first structure 1000 by using each of the first and second power solder balls 131 and 132, the first and second ground solder balls 141 and 142, and the second signal solder ball 152. In an implementation, the upper surface of the second structure 1080 may be spaced apart from each of the passive element 110 and the first and second conductive pads 121 and 122 in the vertical direction DR3.

The third connection terminal 1085 may be on a lower surface of the second structure 1080. The third connection terminal 1085 may convexly protrude from the lower surface of the second structure 1080. The third connection terminal 1085 may be a portion where the second structure 1080 is electrically connected to other external elements. The third connection terminal 1085 may include, e.g., tin (Sn), indium (In), lead (Pb), zinc (Zn), nickel (Ni), gold (Au), silver (Ag), copper (Cu), antimony (Sb), or bismuth (Bi).

The exemplary embodiments of the present disclosure have been described hereinabove with reference to the accompanying drawings, but the present disclosure is not limited to the above-described exemplary embodiments, and may be implemented in various different forms, and one of ordinary skill in the art to which the present disclosure pertains may understand that the present disclosure may be implemented in other specific forms without changing the technical spirit or essential features of the present disclosure. Therefore, it should be understood that the exemplary embodiments described above are illustrative in all aspects and not restrictive.

By way of summation and review, to improve reliability of the semiconductor package, a passive element such as a capacitor may be mounted on a lower surface of the semiconductor package. However, when a crack occurs in solder balls that are connected to the passive element on the lower surface of the semiconductor package and supply power to the passive element, a defect may occur in the semiconductor package. Research is being conducted to reduce the possibility of occurrence of the defect in the semiconductor package. Aspects of the present disclosure provide a semiconductor package having improved reliability of an electrical connection relationship by disposing two or more power solder balls that supply power to a passive element in a region directly adjacent to the passive element to maintain an electrical connection of the remaining power solder balls even if cracks occur in some power solder balls.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made.

What is claimed is:

1. A semiconductor package, comprising:

a first structure including a ball array region on a lower surface of the first structure and an external region completely surrounding the ball array region, the ball array region including a passive element region in which solder balls are not disposed and an edge region completely surrounding the passive element region;

a first semiconductor chip on an upper surface of the first structure;

a passive element in the passive element region on the lower surface of the first structure, the passive element not in the edge region on the lower surface of the first structure;

a first ball array in the edge region on the lower surface of the first structure, the first ball array including two or more first power solder balls supplying power to at least one of the passive element and the first semiconductor chip, the first ball array being directly adjacent to first sidewalls of the passive element in a first horizontal direction and directly adjacent to second sidewalls of the passive element in a second horizontal direction, respectively, the second horizontal direction being perpendicular to the first horizontal direction;

a first conductive pad in the passive element region on the lower surface of the first structure, the first conductive pad connecting the first structure and the passive element to each other, the first conductive pad grounding the passive element; and a second conductive pad in the passive element region on the lower surface of the first structure, the second conductive pad connecting the first structure and the passive element to each other, the second conductive pad being spaced apart from the first conductive pad in the first horizontal direction, the second conductive pad electrically connecting the passive element and the first power solder balls to each other, wherein the passive element is a capacitor.

2. The semiconductor package as claimed in claim 1, wherein the first ball array includes a plurality of solder balls spaced sequentially in a quadrangular shape.

3. The semiconductor package as claimed in claim 1, wherein the first ball array is between the external region and the passive element region.

4. The semiconductor package as claimed in claim 1, wherein:

the edge region includes a first edge region completely surrounding the passive element region and a second edge region completely surrounding the first edge region, and the first ball array includes a second ball array between the passive element region and the second edge region and a third ball array between the first edge region and the external region.

5. The semiconductor package as claimed in claim 1, wherein the first ball array further includes first ground solder balls grounding at least one of the passive element and the first semiconductor chip.

6. The semiconductor package as claimed in claim 5, wherein the first ball array includes only the first power solder balls and the first ground solder balls.

7. The semiconductor package as claimed in claim 1, wherein the first ball array further includes first signal solder balls supplying a signal to at least one of the passive element and the first semiconductor chip.

8. The semiconductor package as claimed in claim 1, wherein the first ball array includes only the first power solder balls.

9. The semiconductor package as claimed in claim 1, wherein the first structure is a printed circuit board.

10. The semiconductor package as claimed in claim 1, further comprising:

a second semiconductor chip spaced apart from the first semiconductor chip in the first horizontal direction on the upper surface of the first structure, the second semiconductor chip being electrically connected to the first semiconductor chip through the first structure; and a second structure connected to the lower surface of the first structure through the first ball array.

11. The semiconductor package as claimed in claim 1, further comprising:

a second structure connected to the lower surface of the first structure through the first ball array;

a third structure on an upper surface of the first semiconductor chip;

a post electrically connecting the first structure and the third structure to each other on a sidewall of the first semiconductor chip; and a second semiconductor chip on an upper surface of the third structure, the second semiconductor chip being electrically connected to the first semiconductor chip through the third structure, the post, and the first structure.

12. The semiconductor package as claimed in claim 1, further comprising:

second power solder balls in the external region on the lower surface of the first structure, the second power solder balls supplying power to the first semiconductor chip;

second ground solder balls in the external region on the lower surface of the first structure, the second ground solder balls grounding the first semiconductor chip; and second signal solder balls in the external region on the lower surface of the first structure, the second signal solder balls supplying a signal to the first semiconductor chip.

13. The semiconductor package as claimed in claim 1, wherein the capacitor is a multilayer ceramic capacitor.

14. A semiconductor package, comprising:

a substrate including a ball array region on a lower surface of the substrate and an external region completely surrounding the ball array region, the ball array region including a passive element region in which solder balls are not disposed and an edge region completely surrounding the passive element region;

a passive element in the passive element region on the lower surface of the substrate, the passive element not in the edge region on the lower surface of the substrate; and a first ball array in the edge region on the lower surface of the substrate, the first ball array including two or more power solder balls supplying power to the passive element through interconnections in the substrate and ground solder balls grounding the passive element through interconnections in the substrate, the first ball array being directly adjacent to first sidewalls of the passive element in a first horizontal direction and directly adjacent to second sidewalls of the passive element in a second horizontal direction, respectively, the second horizontal direction being perpendicular to the first horizontal direction.

15. The semiconductor package as claimed in claim 14, further comprising a first semiconductor chip on an upper surface of the substrate, wherein the power solder balls supply power to the first semiconductor chip, and the ground solder balls ground the first semiconductor chip.

16. The semiconductor package as claimed in claim 14, wherein:

the edge region includes a first edge region completely surrounding the passive element region and a second edge region completely surrounding the first edge region, and the first ball array includes a second ball array between the passive element region and the second edge region and a third ball array between the first edge region and the external region.

17. The semiconductor package as claimed in claim 16, wherein:

the second ball array includes only the ground solder balls, and the third ball array includes only the power solder balls.

18. The semiconductor package as claimed in claim 16, wherein:

the second ball array includes only the power solder balls, and the third ball array includes only the ground solder balls.

19. The semiconductor package as claimed in claim 14, wherein the first ball array further includes signal solder balls supplying a signal to the passive element.

20. A semiconductor package, comprising:

a substrate including a ball array region on a lower surface of the substrate and an external region completely surrounding the ball array region, the ball array region including a passive element region in which solder balls are not disposed and an edge region completely surrounding the passive element region;

a first semiconductor chip on an upper surface of the substrate;

a passive element in the passive element region on the lower surface of the substrate, the passive element not in the edge region on the lower surface of the substrate;

a ball array between the external region and the passive element region on the lower surface of the substrate, the ball array including two or more first power solder balls supplying power to at least one of the passive element and the first semiconductor chip, the ball array including first ground solder balls grounding at least one of the passive element and the first semiconductor chip, the ball array being directly adjacent to first sidewalls of the passive element in a first horizontal direction and directly adjacent to second sidewalls of the passive element in a second horizontal direction, respectively, the second horizontal direction being perpendicular to the first horizontal direction;

a first conductive pad in the passive element region on the lower surface of the substrate, the first conductive pad connecting the substrate and the passive element to each other, the first conductive pad electrically connecting the passive element and the first ground solder balls to each other through interconnections in the substrate;

a second conductive pad in the passive element region on the lower surface of the substrate, the second conductive pad connecting the substrate and the passive element to each other, the second conductive pad being spaced apart from the first conductive pad in the first horizontal direction, the second conductive pad electrically connecting the passive element and the first power solder balls to each other through interconnections in the substrate;

second power solder balls in the external region on the lower surface of the substrate, the second power solder balls supplying power to the first semiconductor chip;
second ground solder balls in the external region on the lower surface of the substrate, the second ground solder balls grounding the first semiconductor chip; and
signal solder balls in the external region on the lower surface of the substrate, the signal solder balls supplying a signal to at least one of the passive element and the first semiconductor chip.

* * * * *